United States Patent [19]

Matsunaga et al.

[11] Patent Number: 5,759,915

[45] Date of Patent: Jun. 2, 1998

[54] METHOD OF FORMING SEMICONDUCTOR DEVICE HAVING AN IMPROVED BURIED ELECTRODE FORMED BY SELECTIVE CVD

[75] Inventors: Noriaki Matsunaga, Hiratsuka; Hideki Shibata; Tadashi Matsuno, both of Yokohama, all of Japan; Takamasa Usui, Wappingers Falls, N.Y.

[73] Assignee: Kabushiki Kaisha Toshiba, Tokyo, Japan

[21] Appl. No.: 749,379

[22] Filed: Nov. 6, 1996

Related U.S. Application Data

[62] Division of Ser. No. 337,916, Nov. 10, 1994, abandoned.

[30] Foreign Application Priority Data

Nov. 11, 1993  [JP]  Japan ................... 5-282198

[51] Int. Cl.⁶ ........................................... H01L 21/28
[52] U.S. Cl. ................... 438/627; 438/637; 438/643; 438/648; 438/650; 438/672; 438/687
[58] Field of Search ....................... 257/750, 751, 257/752, 758, 763, 764, 765, 771, 915; 437/189, 190, 192, 194, 195, 203; 438/637, 643, 648, 650, 672, 634, 687

[56] References Cited

U.S. PATENT DOCUMENTS

| | | | |
|---|---|---|---|
| 5,231,053 | 7/1993 | Bost et al. | 437/192 |
| 5,289,035 | 2/1994 | Bost et al. | 257/915 |
| 5,313,100 | 5/1994 | Ishii et al. | 257/915 |
| 5,341,026 | 8/1994 | Harada et al. | 257/764 |
| 5,355,020 | 10/1994 | Lee et al. | 257/741 |
| 5,380,679 | 1/1995 | Kano | 437/192 |
| 5,385,868 | 1/1995 | Chao et al. | 437/195 |
| 5,404,029 | 4/1995 | Husher et al. | 257/764 |
| 5,444,022 | 8/1995 | Gardner | 437/194 |
| 5,486,492 | 1/1996 | Yamamoto et al. | 437/195 |
| 5,529,954 | 6/1996 | Iijima et al. | 437/192 |
| 5,563,099 | 10/1996 | Grass | 437/194 |

FOREIGN PATENT DOCUMENTS

| | | | |
|---|---|---|---|
| 0271631 | 11/1990 | Japan | 257/763 |
| 0116932 | 5/1991 | Japan | 257/763 |
| 6-037038 | 2/1994 | Japan . | |
| 6-224194 | 8/1994 | Japan . | |

*Primary Examiner*—John Niebling
*Assistant Examiner*—Thomas G. Bilodeau
*Attorney, Agent, or Firm*—Loeb & Loeb LLP

[57] ABSTRACT

The present invention provides a semiconductor device including an improved buried electrode formed by selective CVD. In this semiconductor device, a first insulation layer is formed on a semiconductor substrate. A first conductive layer is formed along an inner surface of a recess of an opening formed on the first insulation layer. A second conductive layer is formed on the first conductive layer in the recess of the opening. The second conductive layer is flush with the first insulation layer. The surfaces of the first and second conductive layers are coated with a third conductive layer. A second insulation layer is formed on the first insulation layer and the third conductive layer. A via hole is formed through the second insulation layer and the third conductive layer and reaches to the second conductive layer. A buried electrode layer is grown in the via hole and formed in contact with the second conductive layer. A fourth insulation layer has a group of conductive layers formed on the second insulation layer and the buried electrode layer and electrically connected to the second conductive layer through the buried electrode layer formed in the via hole.

4 Claims, 4 Drawing Sheets

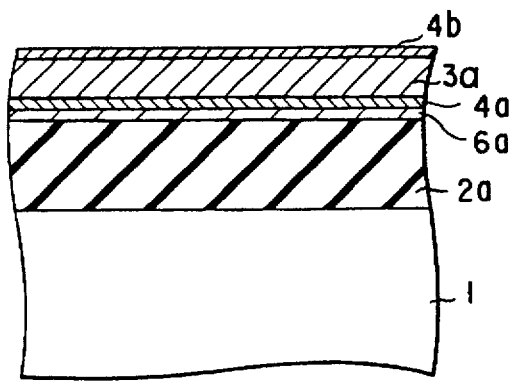
F I G. 12
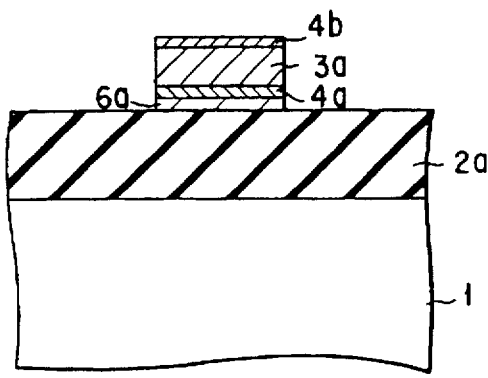
F I G. 13
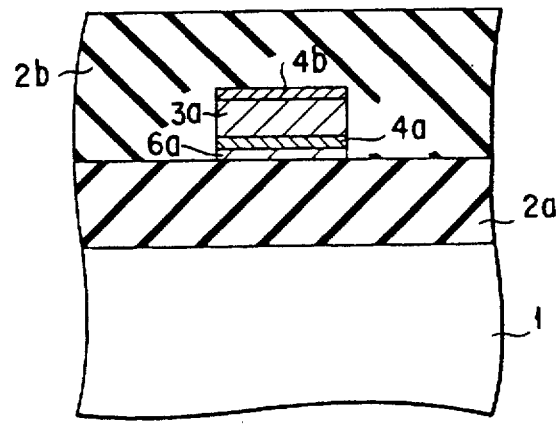
F I G. 14
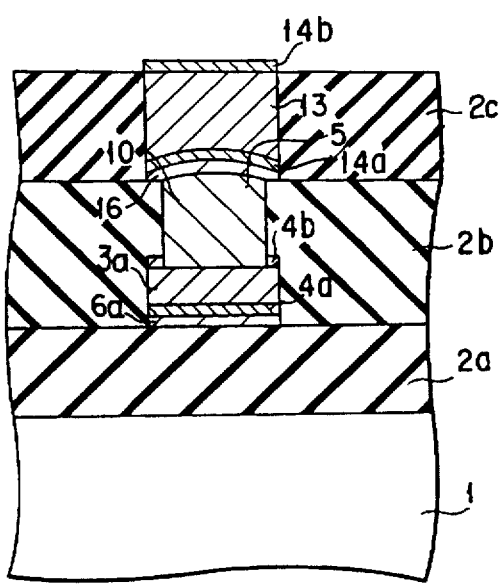
F I G. 15

5,759,915

METHOD OF FORMING SEMICONDUCTOR DEVICE HAVING AN IMPROVED BURIED ELECTRODE FORMED BY SELECTIVE CVD

This is a divisional of application Ser. No. 08/337,916, filed Nov. 10, 1994, now abandoned.

BACKGROUND OF THE INVENTION

1. Field of the Invention

The present invention relates to a semiconductor device having a buried electrode layer which is so formed by selective CVD that the growth time of the buried electrode layer can be secured to prevent the selectiveness of an electrode material and the shape of a buried plug material from being lost, and to a method for manufacturing the same.

2. Description of the Related Art

As an ULSI circuit (Ultra Large Scale Integrated Circuit) is progressing in degree of integration, an interlayer connection hole (hereinafter referred to as a via hole) has been miniaturized more and more, and most via holes have had the aspect ratio of 1 or more.

In the conventional method of forming a wiring layer by sputtering, the inside of a via hole cannot be covered sufficiently, and high reliability of the device is difficult to maintain. Therefore, a technique of filling the via hole with a conductive material, especially, selective CVD using tungsten or a refractory metal for the conductive material is under development.

A conventional method for forming a buried electrode by use of the above selective CVD, which is disclosed in Jpn. Pat. Appln. KOKAI Publication No. 3-116932, will now be described, with reference to FIGS. 1 and 2.

As illustrated in FIG. 1, an insulation layer 102a is formed on a semiconductor substrate 101, and a first conductive layer 103 of copper, which is surrounded by a second conductive layer 104 of titanium nitride, is formed inside the insulation layer 102a. An insulation film 102b is then formed on the insulation layer 102a including the first conductive layer 103, and a via hole 110 is formed in the insulation film 102b by lithography such that the surface of the second conductive layer 104 is exposed.

As shown in FIG. 2, a material such as tungsten is selectively grown to the upper portion of the via hole 110 by the LPCVD (Low Pressure Chemical Vapor Deposition) using WF$_6$+SiH$_4$ as a reactive gas, thereby forming a buried electrode layer 105. After that, other first and second conductive layers 113 and 114 are formed in the same process as that of forming the first and second conductive layers 103 and 104.

Tungsten grows rapidly on the surface of aluminum, copper, silver, or alloys of these metals, whereas it grows slowly on the surface of titanium nitride, niobium, refractory metals such as tungsten, or alloys of these metals. Consequently, the induction time of the buried electrode layer 105 growing on the second conductive layer 104 formed by titanium nitride, is longer than that of the layer 105 growing on the first conductive layer 103 formed by copper. When tungsten, which is the material of the buried electrode layer 105, is grown on the second conductive layer 104, the thickness of the tungsten deposited thereon for a fixed period of time, is relatively small. If, however, the time for depositing the tungsten is simply lengthened, the buried electrode layer 105 having a considerably large thickness can be formed in the via hole 110, but the tungsten will start to grow even on the insulation film 102b, as shown, for example, at 106. This phenomenon is called a loss or disorder of selectiveness. Further, the shape of the plug material (tungsten) deposited in the via hole 110 will be lost. The loss of selectiveness of tungsten causes an electrical short circuit between wires. To eliminate this problem, a step of removing tungsten grown on the insulation film 102b has to be added, thus inevitably increasing the number of manufacturing steps.

SUMMARY OF THE INVENTION

The present invention has been developed in order to resolve the above problem and its object is to provide a semiconductor device having a buried electrode layer which is so formed by selective CVD that its growth time can be secured to prevent the selectiveness of an electrode material and the shape of a buried plug material from being lost or disordered, and to a method for manufacturing the same.

To attain the above object, there is provided a semiconductor device having an improved buried electrode formed by selective CVD, comprising:

a semiconductor substrate;

a first insulation layer formed on the semiconductor substrate;

a first conductive layer formed along an inner surface of a recess of an opening of the first insulation layer;

a second conductive layer formed on the first conductive layer in the recess of the opening, the second conductive layer being flush with the first insulation layer;

a third conductive layer coating a surface of at least the second conductive layer;

a second insulation layer formed on the first insulation layer and the third conductive layer;

a via hole formed through the second insulation layer and the third conductive layer and reaching to the first conductive layer;

a buried electrode layer grown in the via hole and formed in contact with the second conductive layer; and a fourth conductive layer having a group of conductive layers formed on the second insulation layer and the buried electrode layer, and electrically connected to the second conductive layer through the buried electrode layer formed in the via hole.

There is also provided a method for manufacturing a semiconductor device having a buried electrode formed by selective CVD, comprising the steps of:

forming a first insulation layer on a semiconductor substrate and having an opening;

forming a first conductive layer along an inner surface of a recess of an opening of the first insulation layer;

forming a second conductive layer on the first conductive layer in the recess of the opening, the second conductive layer being flush with the first insulation layer;

coating surfaces of the first conductive layer and the second conductive layer with a third conductive layer;

forming a second insulation layer on the first insulation layer and the third conductive layer;

forming a via hole through the second insulation layer and the third conductive layer, the via hole reaching to the second conductive layer;

growing a buried electrode layer in the via hole so as to contact the second conductive layer; and forming a fourth conductive layer on the second insulation layer and the buried electrode layer, the fourth conductive layer having a group of conductive layers electrically connected to the second conductive layer through the buried electrode layer.

According to the above-described method for manufacturing the semiconductor device, the material of the buried electrode layer can be deposited in the via hole before the selectiveness of the material is lost or disordered on the surface of the insulation layer in which the via hole is formed. Consequently, a step of eliminating the material of the buried electrode layer from the surface of the insulation layer can be omitted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 is a cross-sectional view partially showing a semiconductor device according to a second embodiment of the present invention in one step of forming a buried electrode by the selective CVD;

FIG. 13 is a cross-sectional view partially showing the semiconductor device according to the second embodiment in a step subsequent to the step shown in FIG. 12;

FIG. 14 is a cross-sectional view partially showing the semiconductor device according to the second embodiment which is finished after the step shown in FIG. 13; and FIG. 15 is a cross-sectional view partially showing the semiconductor device according to the second embodiment, which is finished by forming a wiring layer on the buried electrode and insulation layer.

DETAILED DESCRIPTION OF THE PREFERRED EMBODIMENTS

Embodiments of the present invention will now be described, with reference to the accompanying drawings.

First, a method for manufacturing a semiconductor device according to the first embodiment of the present invention, will be described, with reference to FIGS. 3 to 11.

Figure 1:
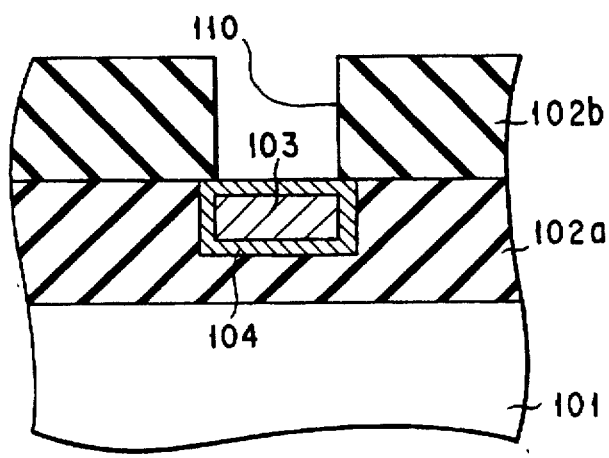
FIG. 1 is a cross-sectional view partially showing a conventional semiconductor device in one step of forming a buried electrode by the selective CVD.
Figure 2:
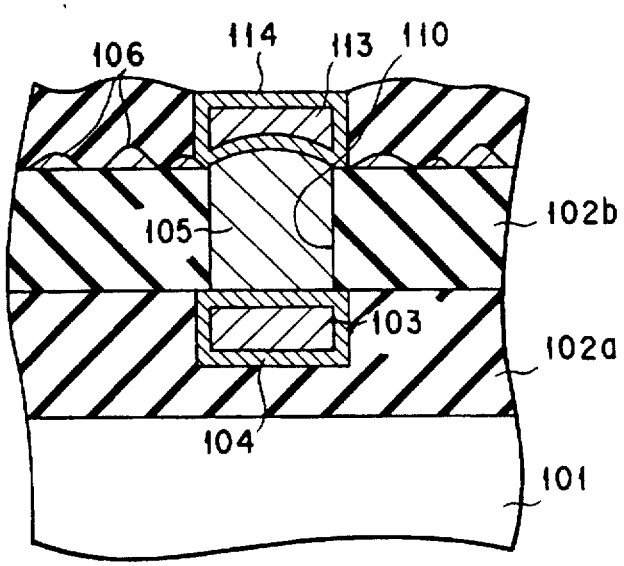
FIG. 2 is a cross-sectional view partially showing the conventional semiconductor device in a step subsequent to the step shown in FIG. 1.
Figure 3:
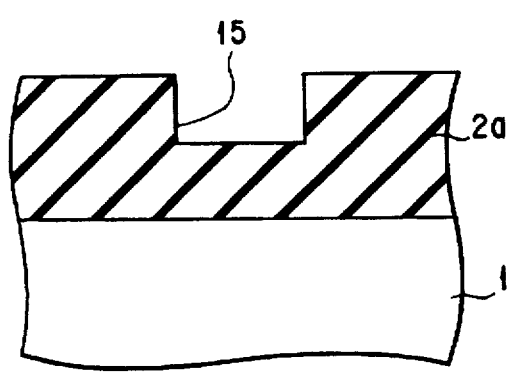
FIG. 3 is a cross-sectional view partially showing a semiconductor device according to a first embodiment of the present invention in one step of forming a buried electrode by the selective CVD.

As shown in FIG. 3, an insulation layer $2a$, which is constituted by a material such as a silicon oxide, is formed on the upper surface of a semiconductor substrate 1 by CVD (chemical vapor deposition) at a temperature of 500° C. in a low-pressure atmosphere of 30 to 250 pa. The CVD can be replaced with both the pyrolysis of TEOS (tetraethoxysilane) using LPCVD (low-pressure CVD) and the LPCVD using a mixture of dichlorosilane and dinitrogen oxide. In the next lithography step, a region 15 in which a wiring layer is to be formed, is patterned. Using the resist as a mask, the insulation layer $2a$ is etched by RIE (reactive ion etching) of a source gas of $CF_4+O_2$ thereby forming an opening 15.

Figure 4:
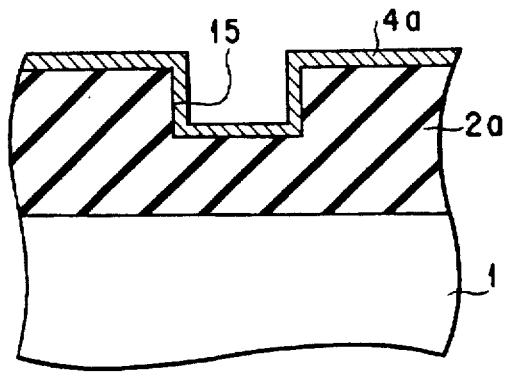
FIG. 4 is a cross-sectional view partially showing the semiconductor device according to the first embodiment in a step subsequent to the step shown in FIG. 3.

After the insulation layer $2a$ is opened, as shown in FIG. 4, titanium nitride (TiN) is deposited on the insulation layer $2a$ by means of the CVD in the low-pressure atmosphere of 30 to 250 pa until its thickness reaches 300 angstroms, and then annealed at a temperature of 450° C. for about thirty minutes, resulting in a first conductive layer $4a$. The TiN can also be deposited by sputtering in an atmosphere of argon of about 1 pa.

Figure 5:
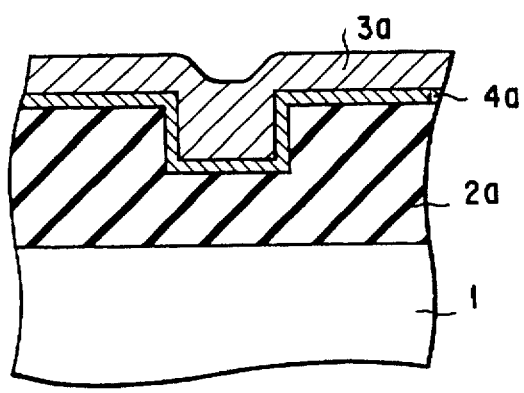
FIG. 5 is a cross-sectional view partially showing the semiconductor device according to the first embodiment in a step subsequent to the step shown in FIG. 4.

As shown in FIG. 5, copper is deposited on the first conductive layer $4a$ by sputtering in an atmosphere of argon of about 1 pa thereby to form a second conductive layer $3a$.

Figure 6:
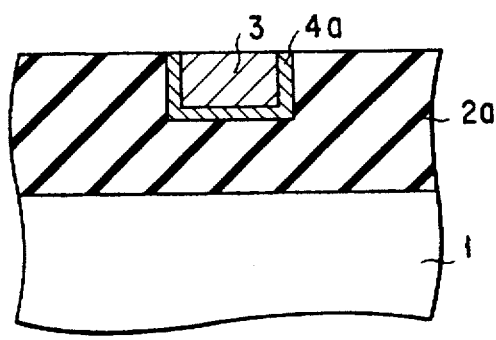
FIG. 6 is a cross-sectional view partially showing the semiconductor device according to the first embodiment in a step subsequent to the step shown in FIG. 5.

As shown in FIG. 6, the second conductive layer $3a$ is etched back by sputtering of an inert gas such as $Ar^+$ and $Xe^+$ until the surface of the insulation layer $2a$ appears, thereby to form a second conductive layer 3. In this step, the second conductive layer 3 as well as the insulation layer $2a$ is flattened. This step can also be executed by a CMP (chemical and mechanical polishing) method.

Figure 7:
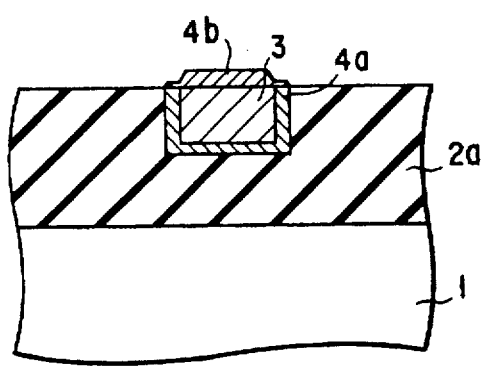
FIG. 7 is a cross-sectional view partially showing the semiconductor device according to the first embodiment in a step subsequent to the step shown in FIG. 6.

Tungsten is selectively grown by 300 angstroms on the second conductive layer 3, as shown in FIG. 7. The tungsten serves as a third conductive layer $4b$. The tungsten of the third conductive layer $4b$ can be replaced with TiN which is the material of the first conductive layer $4a$.

The wiring layer $4b$ has only to be formed by the first and second conductive layers, and a method for forming it is not particularly limited.

Figure 8:
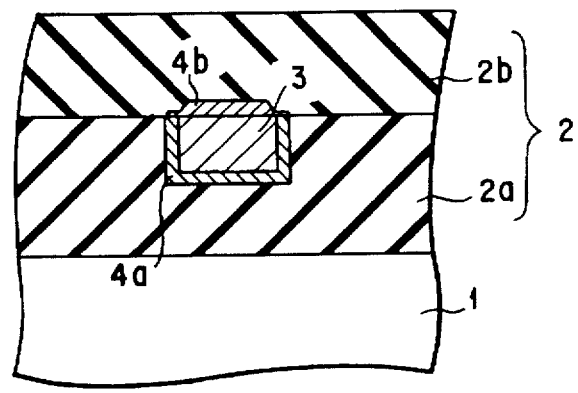
FIG. 8 is a cross-sectional view partially showing the semiconductor device according to the first embodiment in a step subsequent to the step shown in FIG. 7.

As illustrated in FIG. 8, a silicon oxide having a thickness of 1.4 μm is formed on the insulation layer $2a$ and third conductive layer $4b$ under the same conditions as that of forming the insulation layer $2a$. The formed silicon oxide serves as an insulation layer $2b$. In this step, a slight difference in level occurs on the surface of the insulation layer $2b$, under the influence of the shape of the underlayer. However, the difference can be eliminated by forming a resist having the same selectiveness as that of the silicon oxide on the insulation layer 2b and then etching it.

Figure 9:
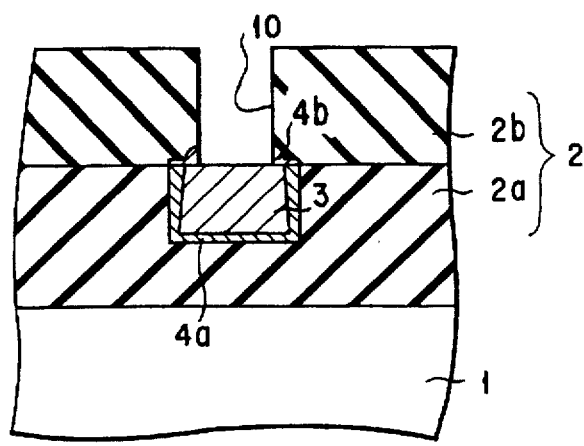
FIG. 9 is a cross-sectional view partially showing the semiconductor device according to the first embodiment in a step subsequent to the step shown in FIG. 8.

As shown in FIG. 9, in the lithography step, those portions of the insulation layer 2b and third conductive layer 4b which are located on the second conductive layer 3 are etched by the RIE of etching gas $C_4F_8$, using the resist formed on the insulation layer 2b as a mask, with the result that a via hole 10 having a diameter of 0.9 µm is formed. The surface of the third conductive layer 4b is exposed by etching the insulation layer 2b. In order to etch the third conductive layer 4b, it is proper that the time for etching the insulation layer 2b should be simply lengthened. The etching gas (echant) makes the etching speed of tungsten and TiN lower than that of the silicon oxide. If the etching time is lengthened, both tungsten and TiN can be removed. Furthermore, the etching conditions, such as etchant, pressure and temperature, can be selected in order to lessen a difference in etching speed between the silicon oxide and the tungsten and TiN.

Figure 10:
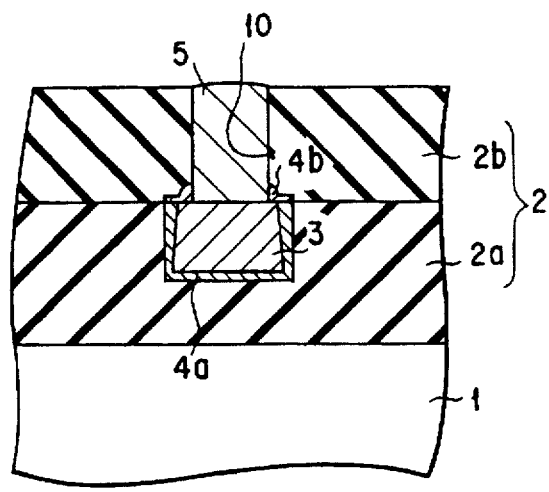
FIG. 10 is a cross-sectional view partially showing the semiconductor device according to the first embodiment in a step subsequent to the step shown in FIG. 9.

As shown in FIG. 10, tungsten is deposited in the via hole 10 by LPCVD in an atmosphere of a mixture of $WF_6$ and $SiH_4$ of 30 to 250 pa, and then annealed at a temperature of about 500° C., thus forming a buried electrode layer 5.

Figure 11:
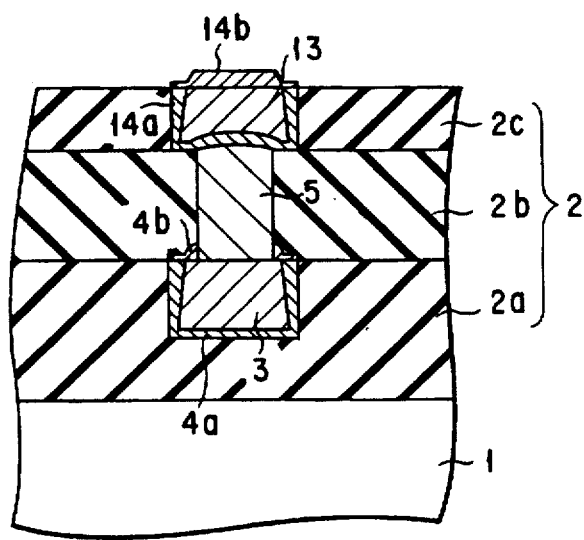
FIG. 11 is a cross-sectional view partially showing the semiconductor device according to the first embodiment which is finished after the step shown in FIG. 10.

As shown in FIG. 11, a silicon oxide 2c is then deposited on the insulation layer 2b and buried electrode layer 5 to form a groove in which a first conductive layer 14a, a second conductive layer 13 and a third conductive layer 14b are formed.

According to the manufacturing method of the first embodiment, as described above, since the second conductive layer 3, which is formed of copper having the shortest induction time for the growth of tungsten, is exposed at the bottom of the via hole 10, the selectiveness of an electrode material and the shape of a buried plug material can be prevented from being lost, thus completing a buried electrode layer having a good shape and good electrical characteristics.

A method of manufacturing a semiconductor device according to the second embodiment of the present invention, will now be described, with reference to FIGS. 12 through 15. The second embodiment differs from the first embodiment in that not all the surfaces of the second conductive layer, which is formed of aluminum, have to be coated with the third conductive layer and, in other words, only the upper surface of the second conductive layer has to be coated with the third conductive layer serving as a reflection-preventing film for preventing an adverse influence upon the lithography step.

As illustrated in FIG. 12, an insulation layer 2a, which is constituted by a material such as a silicon oxide, is formed on the upper surface of a semiconductor substrate 1 by the CVD (chemical vapor deposition) at a temperature of 500° C. in a low-pressure atmosphere of 30 to 250 pa. In this case, the CVD can be replaced with the pyrolysis of TEOS (tetraethoxysilane) using the LPCVD (low-pressure CVD) and the LPCVD using a mixture of dichlorosilane and dinitrogen oxide. By sputtering in an argon atmosphere of about 1 pa, a titanium layer 6a of 300 angstroms as a first conductive layer is formed on the insulation layer 2a, titanium nitride of 700 angstroms as a second conductive layer 4a is formed on the titanium layer 6a, aluminum containing 0.5% copper and 0.4% silicon as impurities is deposited as a third conductive layer 3a on the second conductive layer 4a, and titanium nitride of 300 angstroms is deposited as a fourth conductive layer 4b on the third conductive layer 3a. In the process of forming these layers, the sputtering conditions need not be changed. This process can thus be executed by the same sputtering apparatus.

As shown in FIG. 13, in the lithography step and its subsequent RIE step, the titanium layer 6a, second conductive layer 4a, third conductive layer 3a, and fourth conductive layer 4b are formed. When these layers are formed, $CCl_4$, a mixture of $CCl_4$ and $Cl_2$, $BCl_3$, and a mixture of $BCl_3$ and $Cl_2$ can be used as an etching gas.

After the patterning, as shown in FIG. 14, a silicon oxide is formed on the surfaces of the insulation layer 2a and the fourth conductive layer 4b under the same conditions as in the step of forming the insulation layer 2a. The formed silicon oxide serves as an insulation layer 2b. In this step, a difference in level occurs on the surface of the insulation layer 2b under the influence of the shape of the underlayer. This difference can thus be eliminated by forming a resist having the same selectiveness as that of the silicon oxide on the insulation layer 2b and then etching it.

In the lithography step after the insulation layer 2b is formed, as shown in FIG. 15, using the resist formed on the insulation layer 2b as a mask, those portions of the insulation layer 2b and fourth conductive layer 4b which are located on the third conductive layer 3a are etched by RIE containing etching gas $C_4F_8$, with the result that a via hole 10 having a diameter of 0.9 µm is formed. The surface of the fourth conductive layer 4b appears as the insulation layer 2b is etched. The etching of the fourth conductive layer 4b can be performed by simply lengthening the time for etching the insulation layer 2b. The etching gas (etchant) makes the etching speed of TiN lower than that of the silicon oxide. If the etching time is lengthened, TiN can be removed. Moreover, the etching conditions, such as etchant, pressure and temperature, can be selected in order to lessen a difference in etching speed between the silicon oxide and TiN.

After the buried electrode layer 5 is formed, a silicon oxide 2c is then deposited on the insulation layer 2b and buried electrode 5 to form a groove in which a titanium layer as a first conductive layer 16 is deposited on the buried electrode layer 5 and part of the insulation layer 2b, and a second conductive layer 14a, a third conductive layer 13, and a fourth conductive layer 14b are formed in this order on the titanium layer as a first conductive layer 16, thereby forming a wiring layer.

In the above embodiments of the present invention, the first and third (second and fourth) conductive layers are constituted by TiN and tungsten or titanium and the second (third) conductive layer is constituted by copper and aluminum. The present invention is not limited to these materials. The first and third (second and fourth) conductive layers can be formed by TiN, niobium, a refractory metal, or an alloy of them and the second (third) conductive layer can be formed by aluminum, copper, silver, or an alloy of them. Furthermore, the third (fourth) conductive layer has only to coat at least the upper surface of the second (third) conductive layer.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing a semiconductor device having a buried electrode formed by selective CVD, said method comprising the steps of:

forming a first insulation layer on a semiconductor substrate;

forming a first conductive layer along an inner surface of a recess of an opening of said first insulation layer;

forming a second conductive layer on said first conductive layer in the recess of the opening, said second conductive layer being flush with said first insulation layer;

coating surfaces of said first conductive layer and said second conductive layer with a third conductive layer;

forming a second insulation layer on said first insulation layer and said third conductive layer;

forming a via hole through said second insulation layer and said third conductive layer, said via hole reaching to said second conductive layer;

growing a buried electrode layer in said via hole so as to contact said second conductive layer; and forming a third insulation layer on said second insulation layer and said buried electrode layer, so as to electrically connect said third insulation layer having a group of conductive layers to said second conductive layer through said buried electrode layer.

2. The method as defined in claim 1, wherein an induction time of said second conductive layer required for growth of said buried electrode layer is shorter than an induction time of said first conductive layer.

3. The method as defined in claim 1, wherein said second conductive layer is formed by a material of copper, silver, aluminum, or an alloy containing at least one of copper, silver, and aluminum.

4. The method as defined in claim 1, wherein said first conductive layer is formed by a material of titanium nitride, niobium, refractory metal, or an alloy containing at least one of titanium nitride, niobium, and refractory metal.

* * * * *